US 6,723,915 B2

(12) United States Patent
Radu et al.

(10) Patent No.: US 6,723,915 B2
(45) Date of Patent: Apr. 20, 2004

(54) EMI-SHIELDING RISER CARD FOR A COMPUTER CHASSIS

(75) Inventors: Sergiu Radu, Fremont, CA (US); Russel K. Brovald, Mountain View, CA (US); Randall C. Luckenbihl, Pleasanton, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/021,984

(22) Filed: Dec. 14, 2001

(65) Prior Publication Data

US 2003/0111242 A1 Jun. 19, 2003

(51) Int. Cl.[7] ................................................. H05K 9/00
(52) U.S. Cl. ..................... 174/35 R; 174/255; 174/262; 174/816
(58) Field of Search .......................... 174/35 R, 35 MS, 174/255, 262; 361/816, 818, 800

(56) References Cited

U.S. PATENT DOCUMENTS 5,586,011 A * 12/1996 Alexander .................. 361/818

OTHER PUBLICATIONS

"Investigation Of Internal Partitioning In Metallic Enclosures For EMI Control"; by S. Radu, M. Li, J. Nuebel, D.M. Hockanson, Y. Ji; J.L. Drewniak, T.H. Hubing and T.P. VanDoren Electromagnetic Compatibility Laboratory Department Of Electrical Engineering, University of Missouri–Rolla, Rolla, MO; Electromagnetic Compatibility Group, Sun Microsystems, Inc. Mountain View, CA; pp. 171–176 (0–7803–4140–6/97/$10.00.

* cited by examiner

Primary Examiner—Hung V. Ngo
(74) Attorney, Agent, or Firm—O'Melveny & Myers LLP

(57) ABSTRACT

An EMI-shielding riser card for reducing electromagnetic radiation from a computer enclosure is disclosed. The EMI-shielding riser card is a six-layer riser card having a connector adjacent its lower edge, such as a connector for an NLX system board. A cable connection socket is on the riser card a first distance away from the connector, and a plurality of traces in a signal layer of the riser card run between the cable connection socket and the connector. A first ground layer in the riser card is interposed between the signal layer and a first surface of the riser card. A second ground layer in the riser card is interposed between the signal layer and a second surface of the riser card. The first and second ground layers are configured to attach to a ground connection for a system board for which the riser card is adapted.

19 Claims, 6 Drawing Sheets

EMI-SHIELDING RISER CARD FOR A COMPUTER CHASSIS

BACKGROUND OF THE INVENTION

1. Field of the Invention

The present invention relates to reducing electromagnetic radiation emanating from computer enclosures, and particularly, from enclosures for relatively inexpensive, mass-produced computer systems employing printed circuit board ("PCB") technology.

2. Description of Related Art

As a by-product of normal operation, electronic equipment frequently emits undesirable electromagnetic radiation, often referred to as electromagnetic interference or "EMI." At the same time, equipment specifications require a maximum acceptable level of EMI outside of an electronics enclosure, to comply with government regulations and other performance requirements. For computer systems, EMI requirements are generally complied with by enclosing the computer system in an enclosure made of metal or other conductive material. Openings in the enclosure may be covered with a metallic grill or mesh screen, and the enclosure as a whole constitutes a "Faraday cage." To maintain a perfect Faraday cage over a wide bandwidth, no apertures above a specified size may exist in the shield. The higher the frequency of the EMI, the smaller the shield apertures should be.

In practice, computer enclosures contain some apertures that are not covered by grills or screen, because of penetrations for connectors, openings for insertions of items such as floppy disks, and assembly joints, among other things. Despite openings such as these, EMI requirements for most computer systems have been easily complied with in the past using relatively simple, low-cost enclosures. But the advent of modern computer systems has made compliance with EMI requirements more difficult, particularly for lower-end computer systems that are sold in an extremely cost-competitive market.

That is, it is generally more difficult to meet EMI requirements for modern systems without undesirable cost increases in the enclosures or other system components. Various changes in the industry underlie these new difficulties. For one thing, the increasingly high frequency of commonly available microprocessors, especially above about 500 megahertz, means that computer enclosures must be better sealed against transmission of RF radiation. The higher-frequency microprocessors emit EMI at higher frequencies, which, in turn, can emanate from an enclosure through smaller openings than EMI at lower frequencies. And as frequencies and edge rates in high-speed digital designs continue to increase, EMI as a result of radiation through slots, apertures, and seams in shielding enclosures is becoming increasingly problematic. There is sufficient energy at low-order clock harmonics to cause EMI problems above a few hundred MHz as a result of exciting cavity modes of the enclosure, and efficiently driving even small length slots and apertures that are unavoidable in a practical design.

Consolidation among manufacturers, and the drive towards cost reduction in the computer industry in general, also plays a role. To build a computer system at a competitive cost, a computer manufacturer typically will include certain components that are only available as stock items from a limited number of manufacturers. Peripheral DVD drives are an example of a typical stock item made by relatively few manufacturers. The computer manufacturer often has no direct control over the particular configuration of these stock items. Consequently, a particular stock component that is otherwise desirable may provide a pathway for EMI, particularly at high frequencies, to radiate from a computer enclosure. This pathway may be blocked by customization of the component, but customization of a stock item can add substantially to the system cost.

In particular, certain peripheral components, such as CD and/or DVD drives, essentially include a rectangular-tubular metallic enclosure, very much like a rectangular cross-section waveguide, that is not shielded from transmission of EMI at one or both ends, and are generally mounted inside computer system enclosures with one unshielded end passing through the computer enclosure. For example, in disk drives such as CD, DVD, and floppy disk drives, the disk door on the exterior of the computer enclosure is frequently made of a nonconductive plastic material that does not block transmission of EMI. At the same time, EMI may enter the opposite end of the peripheral enclosure via a cable connection or opening. Hence, the peripheral enclosure can form an efficient waveguide for transmission of EMI at certain frequencies to the exterior of the computer enclosure. For example, certain modern CD/DVD peripherals provide an efficient waveguide for transmission of EMI at frequencies in the range of about 800–1000 MHz. Other components and compartments within computer enclosures may also act as waveguides at these and other frequencies, depending on the details of the component and its relationship to other components of the computer system.

One approach for eliminating the waveguide effect of peripherals such as disk drives is to construct the opening door of a metallic or conductive material. This approach is likely to add to the cost of the component, and is not effective when the peripheral door is open. Another approach is to employ multiple ground points for the peripheral component, but this approach may increase assembly cost, and multiple ground points are subject to being disrupted during repair or replacement of the peripheral component.

A computer enclosure may contain other EMI openings which, for one reason or another, are difficult to block in a reliable, relatively permanent, and low-cost manner. It is desired, therefore, to provide an alternative method and apparatus for preventing EMI transmission through such openings in computer enclosures, including but not limited to openings created by disk drive peripheral components, that overcomes the limitations of the prior art.

SUMMARY OF THE INVENTION

The present invention provides an EMI-shielding riser card for reducing electromagnetic radiation from a computer enclosure, that overcomes the limitations of the prior art. The EMI-shielding riser card comprises a six-layer riser card having a connector adjacent its lower edge, such as a connector for an NLX system board. A cable connection socket is on the riser card a first distance away from the connector, and a plurality of traces in a signal layer of the riser card run between the cable connection socket and the connector. A first ground layer (i.e., a signal return layer) in the riser card is interposed between the signal layer and a first surface of the riser card. A second ground layer in the riser card is interposed between the signal layer and a second surface of the riser card. The first and second ground layers are configured to attach to a ground connection for a system board for which the riser card is adapted.

The six-layer riser card may be adapted for application to computer enclosure enclosing at least one source of electromagnetic radiation of a computer system, where the enclosure includes an unshielded opening in the computer enclosure through which an undesirable amount of electromagnetic radiation from the source is capable of passing to an exterior of the computer enclosure.

Generally, the six-layer riser card is for computer systems having a system board mounted to a frame of the computer enclosure, and a riser card connected to the system board within the computer enclosure. The six-layer card may be configured to replace a conventional four-layer riser card having at least one ground layer and a signal layer. The riser card extends transversely from the system board. The riser card divides an interior space of the computer enclosure into two compartments, a source compartment containing the source of electromagnetic radiation, and an unshielded compartment having the unshielded opening in it. The first ground layer of the riser card is positioned towards a side of the riser card facing the unshielded compartment, and the second ground layer is positioned towards the source compartment. Compartmentalization by the riser card may be most conveniently accomplished in computer systems constructed according to the NLX form factor, in which the prior art frame components and riser card provide a partial but nearly complete physical barrier between two internal compartments of the system.

The six-layer riser card may be used in cooperation with a sheet metal barrier attached to the frame of the computer enclosure and covering an area around a perimeter of the second ground layer. The six-layer riser card and the sheet metal barrier together form an EMI shield between the source compartment and the unshielded compartment, whereby the undesirable amount of electromagnetic radiation from the source is prevented from passing to an exterior of the computer enclosure.

A single ground layer should be sufficient to prevent high-frequency EMI from passing through the riser card. The purpose of the second ground layer is to shield traces on a side of the riser card that would otherwise be exposed to EMI from the source compartment. These traces, when unshielded as in a conventional four-layer card, may act as antennae for receiving electromagnetic radiation from the source compartment and conducting it to a cable socket on the side of the riser card facing the unshielded compartment. A cable connected to the socket may then transmit the radiation to a device such as a CD/DVD drive having an unshielded opening to the exterior of the enclosure. Accordingly, the second ground layer is provided in a layer of the riser card, interposed between the at least one signal layer and the source compartment. The second ground layer covers the traces and thereby prevents them from receiving source radiation. Although herein referred to as a six-layer card, the riser card may contain six or more layers.

In an alternative embodiment, the traces on the source side of the riser card are covered by interposing an auxiliary sheet metal shield between the riser card and the source compartment. The auxiliary shield may be attached to the riser card and connected to its ground layer by fasteners, while being spaced a short distance apart from it by a plurality of spacers. The shield prevents the traces from receiving electromagnetic radiation from the source compartment.

A more complete understanding of the six-layer riser card and its applications for reducing electromagnetic radiation emanating from a computer enclosure will be afforded to those skilled in the art, as well as a realization of additional advantages and objects thereof, by a consideration of the following detailed description of the invention. Reference will be made to the appended sheets of drawings which will first be described briefly.

DETAILED DESCRIPTION

The present invention satisfies the need to reduce electromagnetic radiation emanating from computer enclosures without requiring expensive redesign and remanufacture of conventional components. The invention is especially suitable for use with modern, relatively inexpensive computer systems employing high-frequency (>500 MHz) microprocessors, for which compliance with governmental EMI regulations is required. The invention can be applied to a computer systems and enclosures commonly in use today for a relatively insignificant additional cost. In the detailed description that follows, like element numerals are used to describe like elements shown in one or more of the drawings.

In general, the invention is useful for partitioning the interior space of a computer enclosure into two primary compartments that are electromagnetically isolated at the frequencies of interest. Partitioning can provide several benefits. Primarily, it can isolate a noise source from electronics in one compartment from an exterior aperture in another that could transmit EMI from the enclosure. Secondarily, because the resonant frequency of a cavity is proportional to the dimension of the cavity, each of the smaller compartments will have a higher resonant frequency than the unpartitioned interior space. The compartment resonance may thus be moved beyond certain desired test frequencies. Third, because the stored energy/losses ratio is proportional with the volume/surface ratio of the cavity, each of the smaller compartments will have a lower quality factor, and the maximum field inside will be smaller.

In the present invention, one of the compartments, the source compartment, contains the primary source or sources of electromagnetic radiation. The other compartment, the unshielded compartment, contains any components that are difficult to completely isolate from the exterior of the computer enclosure, such as removable disk drive peripherals. It should be appreciated that the term "unshielded compartment" is intended to include compartments that are partially unshielded from the exterior of the computer enclosure. In practice, partial shielding of the unshielded compartment is still desirable.

Figure 1:
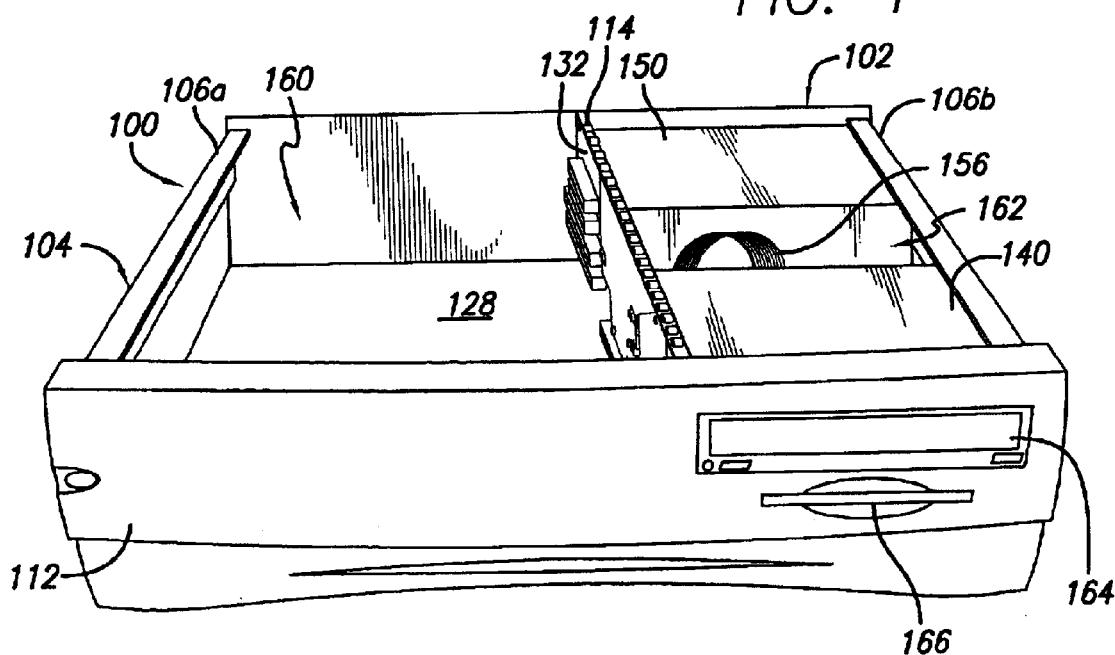
FIG. 1 is a simplified perspective view of an exemplary computer system as adapted according to the invention, with the top cover removed.
Figure 2:
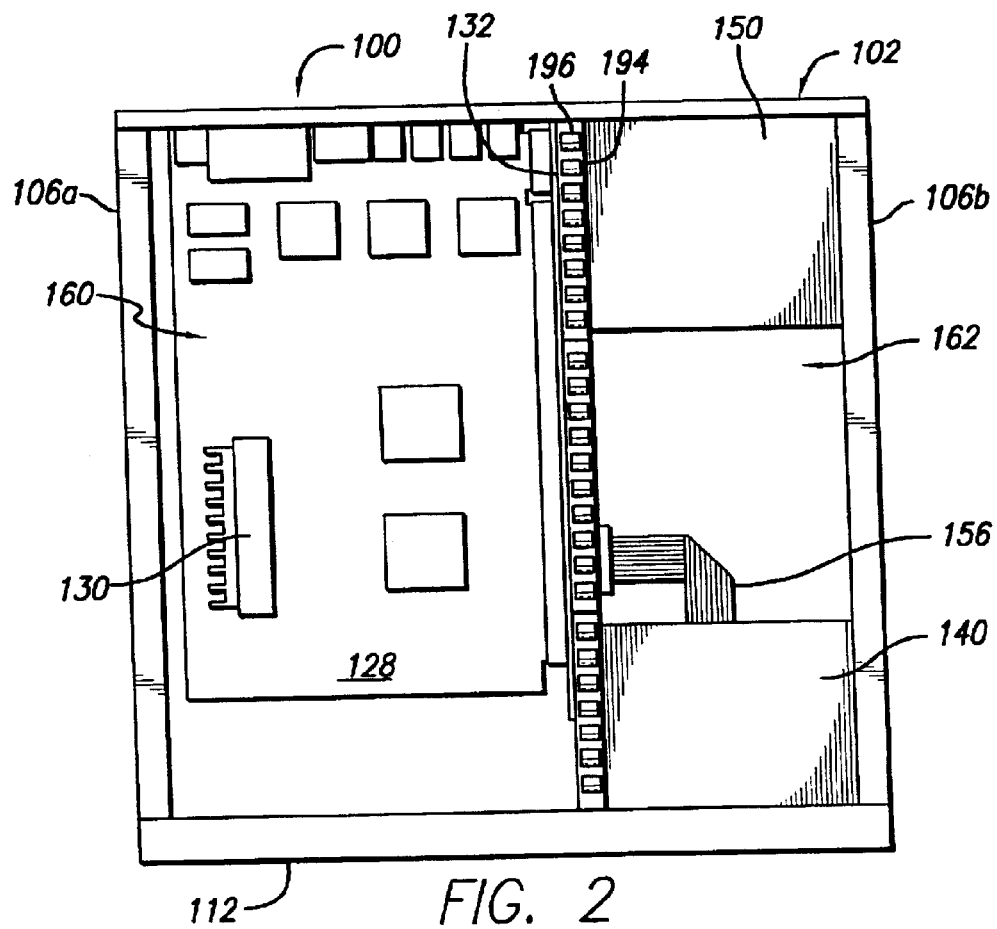
FIG. 2 is a plan view of the system shown in FIG. 1.

An exemplary low-cost computer system 100 for use with the invention is shown in FIG. 1. Certain details have been omitted for illustrative clarity. A plan view of system 100 is shown in FIG. 2. The computer enclosure 102 includes any suitable metal cover (not shown) as known in the art. Typically, a suitable metal cover is configured to slide over the sides and top of the enclosure frame 104, but any other suitable cover may be used. Enclosure 102 is shown with the cover removed to reveal its interior, but it should be appreciated that reduction of EMI from system 100 requires that a suitable cover be in place on frame 104. Frame 104 holds the components of system 100 together and provides support for the metal cover.

Faceplate 112, typically made of a molded plastic material, is attached to the front end of frame 104 and may include one or more apertures that lead into the enclosure 102. For example, apertures for disk drives may be protected by doors 166, 164 for dust control, but these doors are typically made of a plastic material that does not provide any EMI abatement. Hence, at certain frequencies EMI may radiate from the enclosure 102 via doors 164 and/or 166.

System 100, as exemplified in FIGS. 1 and 2, is laid out according to the NLX form factor, as known in the art. NLX is a recognized layout specification for computer systems that is often adopted for modern low-cost, mass-produced systems. One of the primary features of the NLX form factor is a dockable motherboard (system board) that slides into the enclosure 102 and docks with the riser card 132 through a side access port in side 106a of the enclosure (see FIG. 3). The riser card 132 is affixed in a demountable but less conveniently accessed manner to the frame 104, by attachment to the interior midframe 114. Riser card 132 extends transversely from the docked system board 128, and carries sockets for peripheral cards that may be added to system 100, as well as connectors for peripheral components such as disk drives. In essence, the NLX form factor reverses the older practice of designing systems in which the system board is the component that is least easily removed from the enclosure, and the peripheral riser cards are plugged into sockets on the system board.

The interior of enclosure 102 includes two primary compartments 160, 162 divided by middle frame member ("midframe") 114 and riser card 132. Source compartment 160 contains the system board 128, which, in turn, carries the microprocessor 130 and other semiconductor devices that may emit electromagnetic radiation into compartment 160. Source compartment 160 is configured as a Faraday cage that is sufficiently sealed to prevent excessive EMI from source compartment 160 from reaching the exterior of enclosure 102. For example, source compartment may be configured to comply with United States Federal Communications Commission ("FCC") regulations for EMI, using techniques as known in the art for selection of enclosure materials and maximum allowable aperture size in the exterior walls of compartment 160. FCC specifications currently apply up to a frequency of the $5^{th}$ harmonic of the highest clock. For example, if equipment is tested up to 2 GHz, this corresponds to a recommended maximum aperture dimension "L" of 0.75 cm, by application of the $\frac{1}{20}^{th}$ rule (i.e., L=$\lambda$/20). In the alternative, the source compartment 160 may be similarly configured to comply with any other applicable standard or specification for EMI abatement.

Another feature of the NLX form factor is the location of all drive bays for disk drives, such as removable disk drive 140, on a side of the riser card opposite from the side into which the system board 128 is docked. The space between the riser card 132 and the side wall 106b of the enclosure forms a compartment 162. Conveniently, this location in compartment 162 permits the riser card 132 to serve as a partial EMI shield between the system board 128 and the disk drives, such as drives 140, but the NLX specification does not describe a method for a completely effective EMI barrier between the source compartment 160 and compartment 162. In conventional NLX systems, any shielding provided by the riser card 132 is incidental, and is insufficient to prevent EMI at high frequencies from escaping through the disk drive apertures or other openings in compartment 162.

As described above, complete EMI shielding of compartment 162 is hindered by the use of stock disk drive components, such as drive 140, that cannot easily be altered to provide adequate EMI shielding. Hence, compartment 162 is described herein as an unshielded compartment. Compartment 162 may contain other components, such as a power supply 150 and a sealed hard disk drive (not shown). It does not contain any significant sources of EMI except such as may be contained in, and shielded by, components within the compartment 162, such as power supply 150 and disk drive 140.

In conventional NLX systems, the midframe 114 is configured primarily as a structural member of frame 104 and as a mountable support for the riser card 132. According to the invention, the midframe 114 may be additionally provided with a sheet metal shield 118 (shown in FIG. 3) that surrounds a perimeter of a defined portion or portions of the riser card 132. The sheet metal shield 118 may be formed integrally with midframe 114. An exemplary configuration of such a sheet metal shield 118 is described later in the specification. The riser card 132 and midframe 114 may thus be positioned relative to one another such that the conductive ground layer of the riser card and midframe 114 cooperate to close all apertures of concern between compartments 160, 162. For example, those apertures larger than the maximum recommended size may be closed by positioning a properly configured midframe and riser card. The ground layer of riser card 132 may be oriented towards compartment 162.

The NLX standard further provides for riser card 132 to have peripheral port sockets on its side facing the unshielded compartment 162. A suitable cable, such as ribbon cable 156, may be plugged into the riser card and connected to a corresponding peripheral component, such as removable disk drive 140, in the unshielded compartment 162. The peripheral port sockets on the riser card 132 are connected to traces on the side of riser card facing the source compartment 160 by vias that pass through the riser card. Undesirably, in a conventional four-layer card these traces may then act as antennae to receive electromagnetic radiation from the source compartment, and to conduct the EMI signal through cable 156 directly into drive 140. Drive 140, in turn, may serve as a waveguide to efficiently drive certain EMI frequencies through door 164. To prevent this phenomena, the invention provides that the traces on the riser card may be shielded from the source compartment 160 by a second ground layer of a six-layer card, such as riser card 180 described later in the specification. In the alternative, a suitable auxiliary shield 200 may be mounted to a conventional four-layer riser card. Exemplary auxiliary shields for riser cards are described later in the specification.

Additionally, midframe 114 may be provided with an EMI gasket 194 along its top edge to ensure that the EMI barrier provided by the riser card 132, midframe 114, and auxiliary shield 200 is preserved. Various suitable EMI gaskets are commonly available, comprising a row of regularly spaced resilient conductive fingers 196 that extend uniformly from the gasket. The EMI gasket 194 ensures that conductive contact and a known maximum aperture size is established between the top cover (not shown) of the enclosure and the midframe 114. Without EMI gasket 194, dimensional tolerance buildup or flexure of the top cover may open up apertures between the midframe 114 and the top cover that exceed the maximum recommended aperture size, thereby degrading the EMI shielding effect provided by the midframe 114/riser card 132 assembly.

Because of the location and configuration of riser card 132, the invention is conveniently applied to NLX systems, but is not limited to such systems. The invention may be applied to any system in which a transverse riser card is available between the EMI sources on the system board and a portion of the enclosure that contains unshielded openings.

Figure 3:
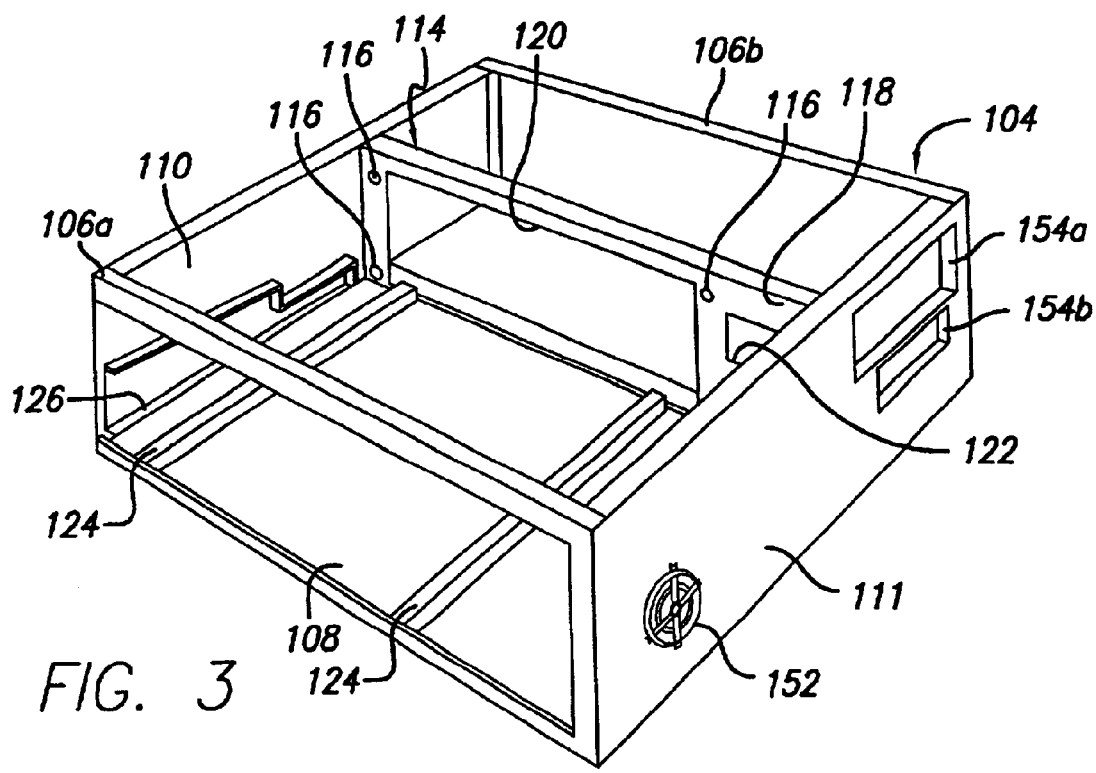
FIG. 3 is a simplified perspective view of an exemplary frame for a computer enclosure for use with the invention, showing the relationship of respective frame members.

An exemplary frame 104 for a computer enclosure according to the invention is shown in FIG. 3. Details of the frame may vary within the scope of the invention. The midframe 114 extends between the back frame 110 and the front frame 111. The front frame 111 contains openings 154a, 154b for drive bays on one side of the midframe 114, and may contain one or more screened ventilation ports 152 on the other side of the midframe. Back frame 110 contains a back panel opening for the back panel of the system board, which may mount to rails 124 on bottom 108. Side frames 106a, 106b connect the back frame 110 to the front frame 111 at the opposite sides of frame 108 and support the corners of the enclosure cover.

The shape of the midframe 114 is of particular importance. Generally, the midframe has at least a primary opening 120 that is slightly smaller than the riser card that will be mounted to it. Mounting holes 116 correspond to mounting holes 142 in the riser card 132 (shown in FIG. 4). Sheet metal shield 118 generally fills the remainder of the area in the layer of midframe 114, providing an EMI barrier between the two compartments. However, the sheet metal shield may contain other relatively small openings, such as opening 122, for ventilation or cabling feed-through. The size of opening 122 should be below the maximum recommended aperture size. In the alternative, opening 122 may be located in a position that, because of the configuration of interior components, does not lead to transmission of EMI from the unshielded compartment. Other details of frame 104 may be as known in the art.

Figure 4:
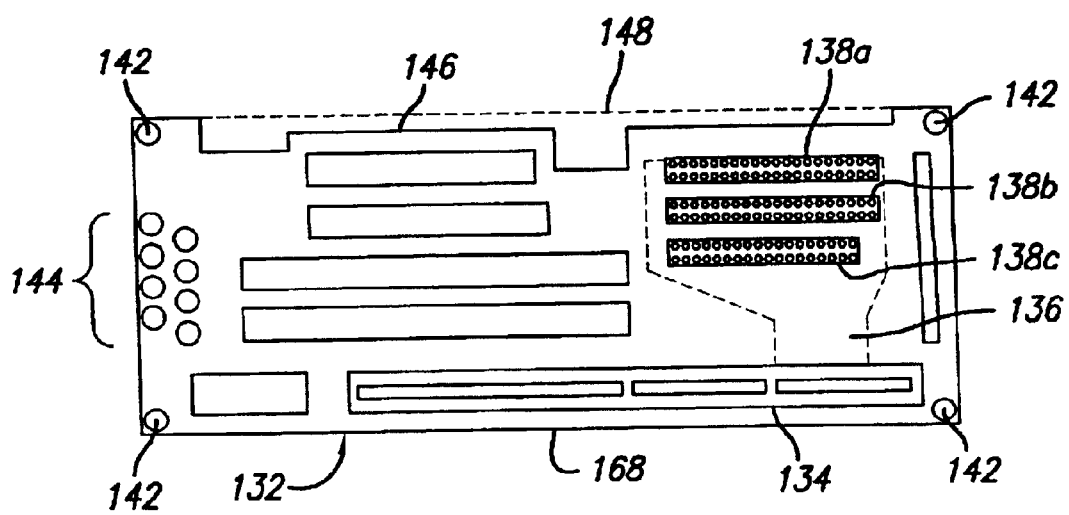
FIG. 4 is a plan view of an exemplary riser card for use with the invention.

An exemplary riser card 132 for use with an NLX system is shown in FIG. 4. Generally, the features of the riser card may be as known in the art. Four mounting holes 142 are in the four corners of the card for mounting to midframe 114. Riser connector 134 is for connecting to the system board. Peripheral port sockets 138a–c are on the reverse side of the riser card, and are connected by traces 136 on the system side of the card to the riser connector 134.

Certain features of the prior art riser card 132, such as ventilation holes 144 and a notched top edge 146, may be undesirable. Ventilation holes and other holes, if present, should be below the maximum recommended aperture size. A straight upper edge 148, corresponding to the top edge of opening 120 in midframe 114, may be more suitable than a notched edge. Generally, it may be desirable to separately ventilate the two compartments of the system, instead of relying on openings in the riser card and/or midframe to provide cross-ventilation.

Figure 5:
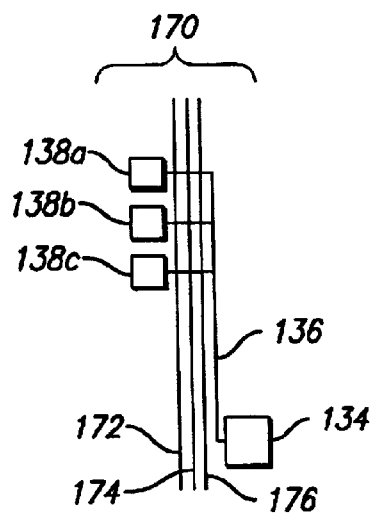
FIG. 5 is schematic diagram showing selected components of a riser card for use with the invention.

The EMI-shielding properties of the riser card 132 arise from its ground layer that is generally coextensive with the perimeter 168 of riser card 132. FIG. 5 shows the ground layer 174 and other components of a conventional four-layer riser card 170 in an exploded schematic cross-sectional view. It should be appreciated that the riser card may include other layers, such as resin layers, that are not shown. The view is taken through the location of the peripheral port sockets 138a–c to show an exemplary configuration of the traces 136 of a signal layer. Ground layer 174 may be positioned between other layers 172, 176, such a power layer and/or a signal layer, which may be in any order as known in the art. Traces 136 face the source compartment and pass through vias in the riser card 170 to connect the peripheral port sockets 138a–c in the unshielded compartment to the riser connector 134. Hence, traces 136 may receive electromagnetic radiation from the source compartment and transmit it to the ports 138a–c in the unshielded compartment.

Figure 6:
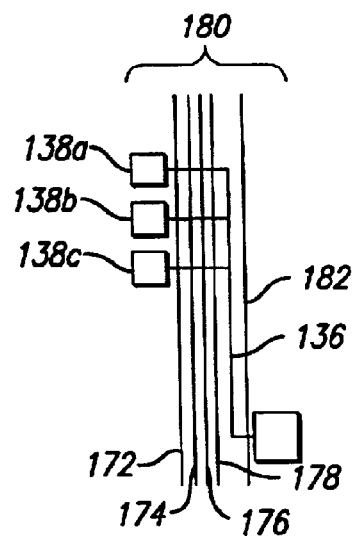
FIG. 6 is a schematic diagram showing selected components of a riser card according to an alternative embodiment of the invention.

To prevent this transmission, a six-layer riser card 180 may be provided, as shown in FIG. 6. The sockets 138a–c, layers 172, 176, ground layer 174, and traces 136, may be as previously described, and other layers such as resin layers are not shown for purposes of simplicity. An additional layer 178 may be disposed adjacent to the signal layer (which includes traces 136), and a second ground layer 182 is disposed over the traces 136. Traces 136 may pass through vias in the layers 172–178 and ground layer 182 to connect to riser connector 134, and are generally shielded from the source compartment. Layers 172–178 may be of any type, such as signal, power, ground, or combination, and may be in any desired order. Additionally, the signal layer containing traces 136 need not be immediately adjacent to ground layer 182, nor is ground layer 182 required to be an outermost layer. Ground layer 182 covers a sufficient portion of any traces (such as traces 136) that may be connected to ports 138a–c or any other device on the unshielded side of card 180 to prevent transmission of undesirable EMI to the unshielded compartment. For example, layer 182 may cover substantially all of such traces, or a majority of such traces, depending on the application requirements. Whatever the specific arrangement of layers, ground layer 182 is positioned to be interposed between the source compartment and any such traces that may be connected to any device on the unshielded side of riser card 180 when it is mounted in its intended position in a computer enclosure. Accordingly, riser card 180 will no longer transmit EMI to the unshielded compartment, and no local auxiliary shield is needed. A further advantage of the second ground layer 182 is that transmission of EMI to other components that may be connected to the riser card may also be avoided, because all of the signal layer or layers may be readily shielded from the source compartment.

Figure 7:
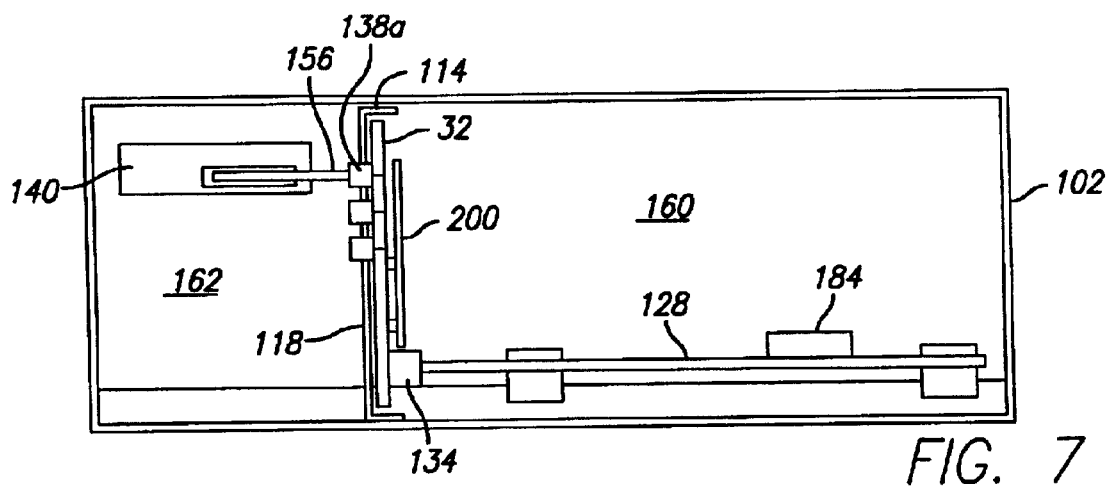
FIG. 7 is a schematic diagram representing the interior of a computer enclosure for an exemplary system configured according to the invention.

The interior of a computer enclosure 102 for an exemplary NLX system configured according to the invention is shown in FIG. 7. Midframe 114, including sheet metal shield 118, and riser card 132 divide the interior space into two primary compartments 160, 162. Source compartment 160 contains system board 128 and microprocessor (source) 184. Unshielded compartment 162 contains a peripheral drive 140 connected by a cable to socket 138a. The riser card may be a six-layer card like riser card 170 described above. In the alternative, an auxiliary shield 200 may be attached to a conventional four-layer riser card 132 over the traces connecting riser connector 134 to the sockets, such as socket 138a, in the unshielded compartment 162.

Figure 8:
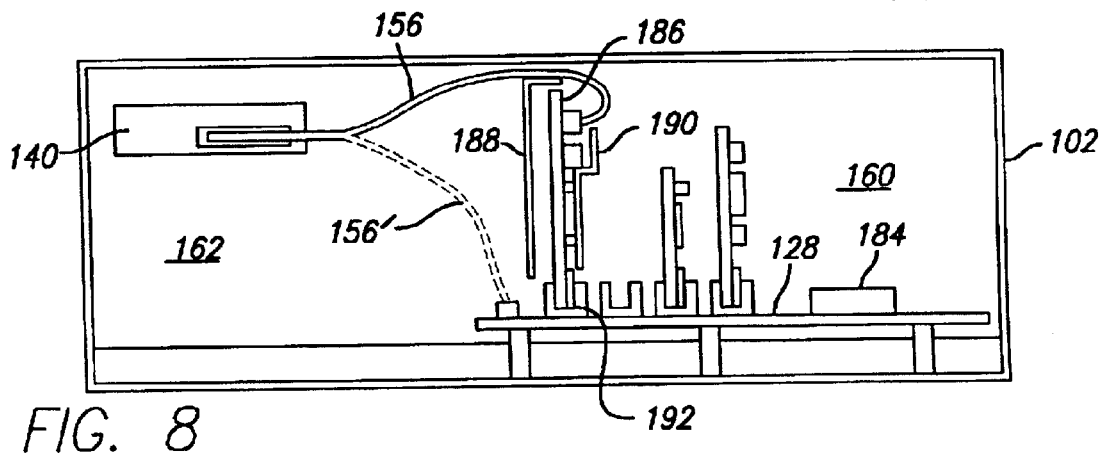
FIG. 8 is an schematic diagram representing the interior of a computer enclosure for an exemplary system configured according to an alternative embodiment of the invention.

The invention is not limited to use with NLX systems. FIG. 8 shows an exemplary non-NLX system configured according to the invention. A PCI-type riser card 186 and other riser cards plug into sockets 192 on system board 128. A cable 156 connects drive 140 to a socket on card 186. A sheet metal barrier 188 may be placed adjacent to riser card 186 to isolate an unshielded compartment 162 from source compartment 160. Barrier 188 may be designed to shield in cooperation with the riser card 186, i.e., it may have an primary opening somewhat smaller than the area of the riser card, similar to the sheet metal barrier 118 described above. In the alternative, barrier 188 may have no openings except as are needed for passing cables or for ventilation. Such openings should be smaller than the maximum recommended aperture size. Barrier 188 may also include an EMI gasket (not shown) as previously described for midframe 114. Traces on card 186 that are exposed to source compartment 160 may be covered with a local auxiliary shield 190 similar to shield 200 described herein.

Barrier 188 can also be used for systems in which peripheral drives are connected to sockets on the system board, such as by cable 156'. These systems may required local shielding of traces on the system board 128 that lead to sockets for the drive cables. A shield similar to shields 190, 200 may be used to shield critical areas of a system board, preventing transmission of EMI through cable 156'.

Figure 9A:
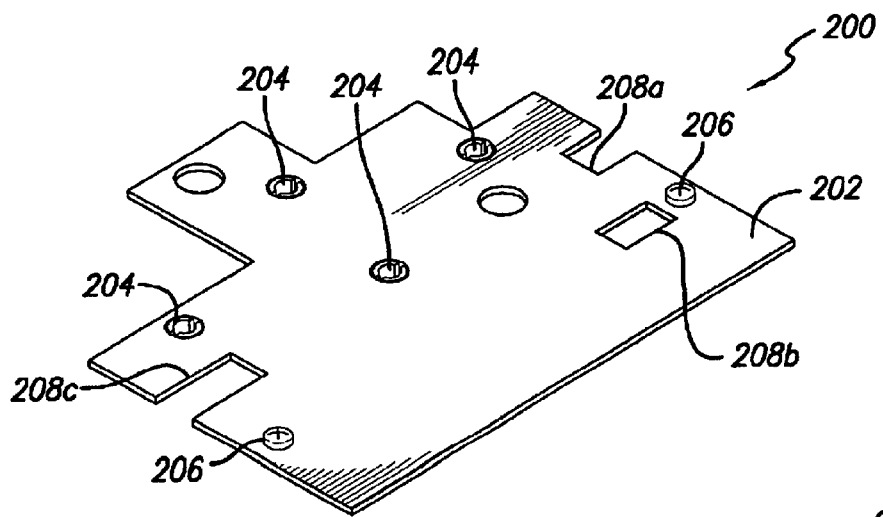
FIG. 9A is a perspective view of a riser card shield according to an embodiment of the invention.
Figure 9B:
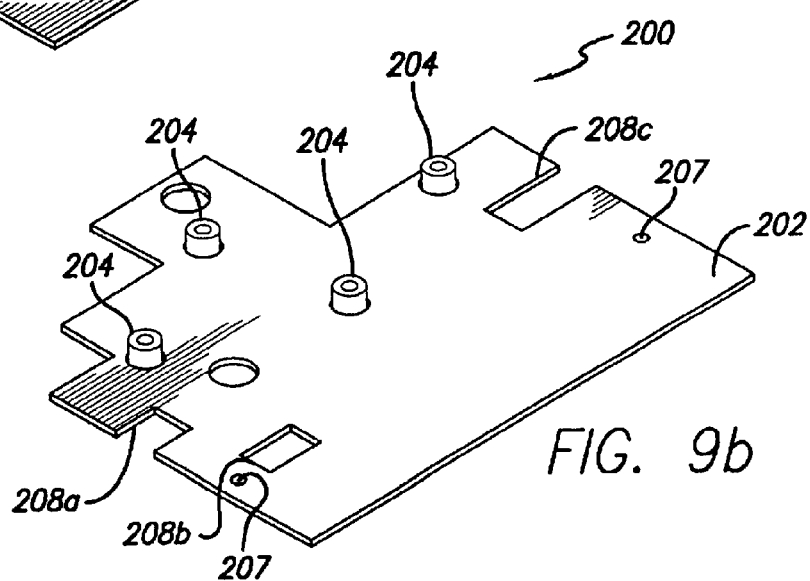
FIG. 9B is a perspective view showing a reverse side of the shield shown in FIG. 11A.

An exemplary local auxiliary shield 200 for a riser card is shown in FIGS. 9A and 9B. Selection of shield materials and design of shield thickness may be as known in the art, and shield 200 may be inexpensively stamped from any suitable stock material. More highly conductive metals, such as copper or aluminum, may be especially suitable to shield against high frequency EMI from the system microprocessor. The sheet metal 202 of shield 200 is shaped according to the particular configuration of the riser card that it is designed for. For example, the shield may include openings or notches 208a–c to accommodate sockets or other protruding features of the riser card. The shape of shield 200 is otherwise determined by the shape of the area on the riser card that is to be covered. Shield 200 need be no larger than is needed to cover all of the traces on the source side of the riser card leading to the peripheral drive sockets. Little or no benefit is derived from an oversized shield. On the other hand, it may not be necessary to completely cover the traces on the riser card, depending on particular system characteristics.

Shield 200 may include through holes 207, each for one of fasteners 206 for attaching the shield to a riser card. Fasteners 206 may be threaded fasteners such as machine screws designed for threaded inserts (not shown) in the riser card. The threaded inserts in the riser card may be made of a conductive material and mounted in the riser card such that they are in contact with the ground layer of the riser card. Shield 200 may then be conveniently grounded by attaching it to the riser card using metallic screws. In the alternative, and less preferably, the shield may be grounded by connecting one or more wire grounds to the shield and to suitable ground points on the system board.

Shield 200 may include spacers 204 for holding the shield spaced apart from a riser card. Each spacer 204 may be pressed into a mounting hole or otherwise affixed to shield 200. When shield 200 is attached to a riser card, spacers 204 maintain a uniform spacing between the shield and the riser card, and prevent the shield from contracting traces or other components on the riser card. The spacers should not be too high (such as less than about 0.5 cm) so as to hold the shield close to the riser card. Spacers 204 may be made of a non-conductive or a conductive material, if desired. If a spacer is positioned where it may contact a trace or other element of the riser card (besides a ground layer), it should be made of a non-conductive material. If a spacer is positioned where it may contact a ground layer of the riser card, it may be useful to make the spacer of a conductive material, to provide another grounding point. Both conductive and non-conductive spacers may be used on a single shield 200.

Figure 10:
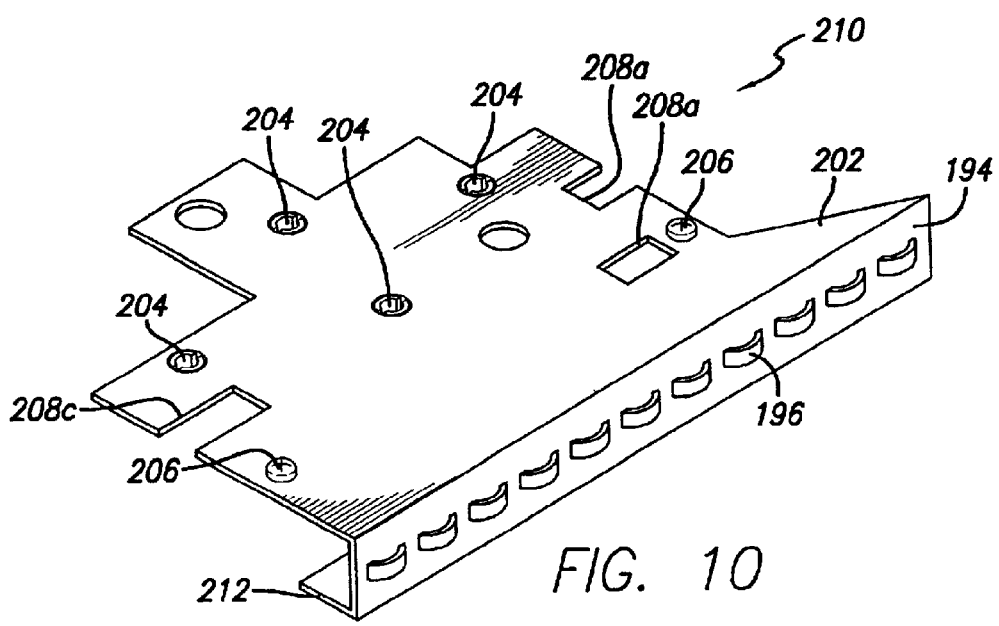
FIG. 10 is a perspective view of a riser card shield according to an alternative embodiment of the invention.

The auxiliary shield need not be flat, and can be bent to accommodate contours of the riser card or midframe. FIG. 10 shows one such riser card shield 210, according to an alternative embodiment of the invention. Shield 210 is similar to shield 200 previously described, and additionally includes a lip 212 designed to fit over an upper edge of the riser card. The top surface 194 of the lip 212 may include an EMI gasket having a row of resilient conductive fingers 196 positioned to be level with a similar EMI gasket on an upper surface of the midframe. The lip 212 may hang over the midframe and help to stabilize the riser card prior to attaching the riser card to the midframe. Lip 212 may also provide improved shielding of the peripheral port sockets adjacent to a top edge of the riser card.

Figure 11:
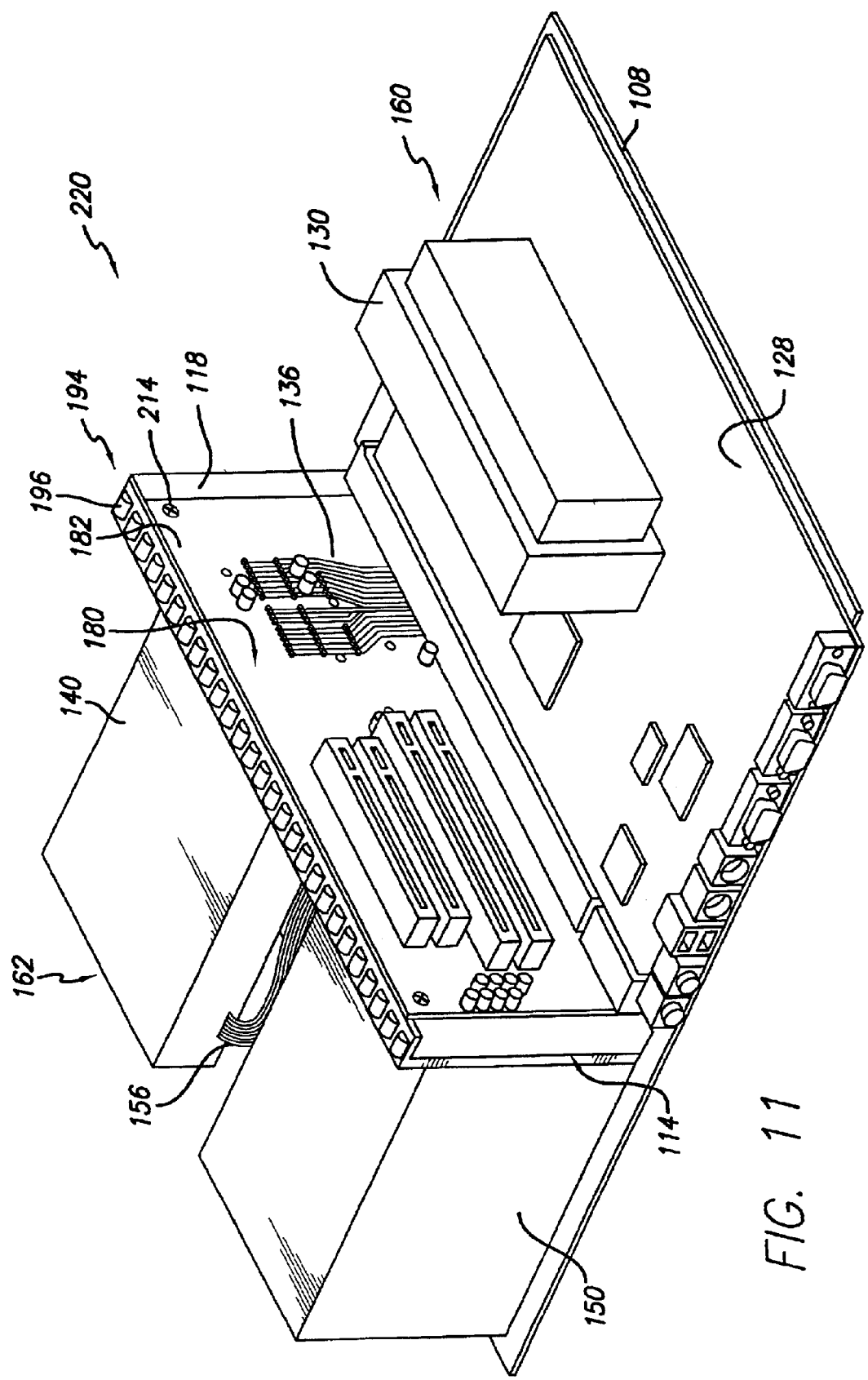
FIG. 11 is a simplified perspective view showing exemplary interior components of a system configured according to the invention.

An exemplary application of six-layer riser card 180 in a system 220 without a local auxiliary shield is shown in FIG. 11. Most of the enclosure 102 and frame 104 have been removed to reveal the interior components. Source 130 (microprocessors) are mounted on system board 128 in source compartment 160. System board 128 is connected to six-layer riser card 180, having ground layers on either side of a signal layer. Riser card 180 extends transversely from system board 128 and together with midframe 114 and its sheet metal barrier 118 blocks electromagnetic radiation from entering unshielded compartment 162. An EMI gasket 194 with a row of resilient fingers 196 is disposed along a top edge of the midframe 114 ensure conductive contact between a cover of the enclosure and the midframe 114 at intervals no greater than the maximum recommended aperture size. Drive 140 in compartment 162 is connected to riser card 180 via cable 156. Traces 136 connected to cable 156 are covered by the second ground layer 182, and thereby cannot transmit EMI to drive 140.

Figure 12:
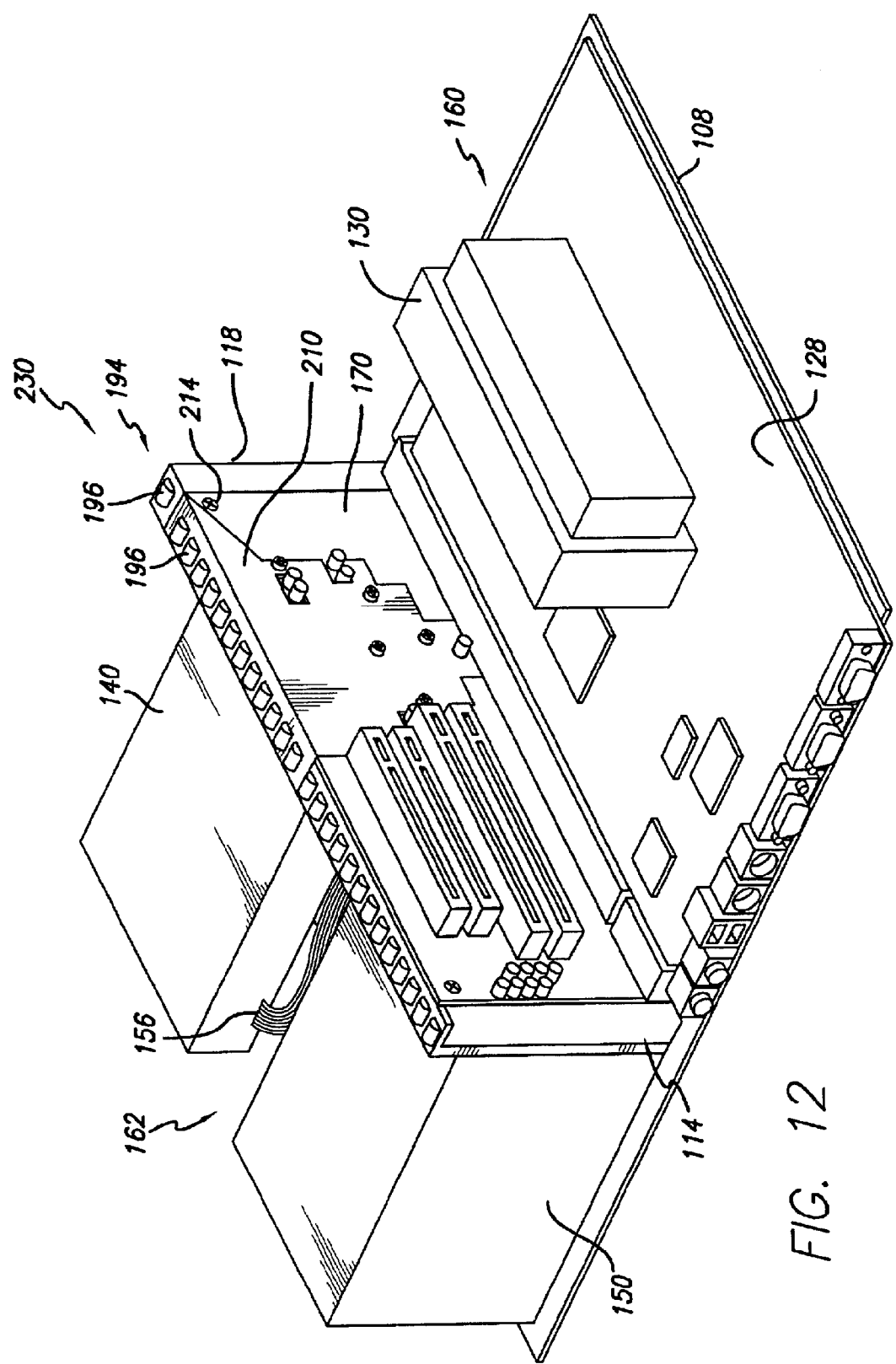
FIG. 12 is a simplified perspective view showing exemplary interior components of a system configured according to an alternative embodiment of the invention.

An exemplary application of a riser card 170 in an EMI barrier using a local auxiliary shield 210 is shown in FIG. 12. Riser card 170 is a conventional four-layer type card with traces exposed to the source compartment. Local shield 210 is fastened against the riser card and covers the traces. Other details of system 230 are similar to system 220 shown in FIG. 11.

Having thus described an embodiment of the six-layer riser card and its applications for reducing electromagnetic radiation from a computer system, it should be apparent to those skilled in the art that certain advantages of the within system have been achieved. It should also be appreciated that various modifications, adaptations, and alternative embodiments thereof may be made within the scope and spirit of the present invention. For example, embodiments have been described in systems having the NLX form factor, but the invention is not limited to NLX systems. The invention is further defined by the following claims.

What is claimed is:

1. An EMI-shielding riser card comprising at least six stacked adjoining layers:
   at least three ground layers;
   at least one power layer; and
   at least two signal layers, at least one of the at least two signal layers including a via formed therein;
   a trace on a surface of the at least one signal layer including the via, the trace running through the via;
   wherein the EMI-shielding riser card is a flat sheet of layered material shaped to fill an opening between two compartments of a computer enclosure, thereby dividing the computer enclosure into an EMI source compartment containing a source of EMI and an unshielded compartment containing a device, wherein the trace is in electrical communication with the EMI source and the device, and wherein at least one of the at least three ground layers is positioned to be interposed between the EMI source compartment and the at least two signal layers, and to cover the via and substantially all of the trace that is in electrical communication with the device in the unshielded compartment when the riser card is mounted in the computer enclosure.

2. The EMI-shielding riser card of claim 1, the riser card is configured for an NLX system.

3. The EMI-shielding riser card of claim 1, wherein the at least three ground layers are configured to connect to a ground connection of a computer system.

4. The EMI-shielding riser card of claim 1, wherein the riser card is rectangular.

5. The EMI-shielding riser card of claim 4, further comprising a through hole for mounting to a frame adjacent to each of four corners of the riser card.

6. The EMI-shielding riser card of claim 1, further comprising at least one peripheral port socket on a first surface of the riser card configured to face the unshielded compartment.

7. The EMI-shielding riser card of claim 1, further comprising at least one connector on a second surface of the riser card configured to face the EMI source compartment.

8. The EMI-shielding riser card of claim 6, further comprising at least one connector on a second surface of the riser card configured to face the EMI source compartment.

9. The EMI-shielding riser card of claim 6, further comprising a plurality of vias through at least one layer of the riser card for connecting at least one signal layer to the at least one peripheral port socket.

10. The EMI-shielding riser card of claim 7, further comprising a plurality of vias through at least one ground layer for connecting at least one signal layer to the connector.

11. The EMI-shielding riser card of claim 8, further comprising a plurality of vias through the at least six stacked adjoining layers for connecting the connector to the at least one peripheral port socket.

12. A riser card configured to be positioned within a computer enclosure containing a system board, the computer enclosure defining a source compartment and an unshielded compartment therein, comprising:
    a ground layer;
    a signal layer operably coupled to the ground layer;
    a connector adjacent to an edge of the riser card;
    a cable connection socket on the riser card a first distance away from the connector; and,
    a trace on a surface of the signal layer, the trace running between the connector and the cable connection socket,
    wherein the ground layer is configured to be positioned within the enclosure between the source compartment and the unshielded compartment, and wherein the connector is configured to connect the riser card to the system board so that the riser card is substantially orthogonal to the system board, and wherein the signal layer and the ground layer are arranged such that, when the riser card is positioned within the computer enclosure, the ground layer is interposed between the source compartment and the signal layer so that the ground layer covers substantially all of the trace.

13. The riser card of claim 12, wherein the cable connection socket faces the unshielded compartment, when the riser card is positioned within the enclosure.

14. The riser card of claim 12, wherein the riser card includes a via formed therein, the trace running through the via, wherein the ground layer is positioned to cover the via and substantially all of the trace that is connected to the cable connection socket.

15. The riser card of claim 12, wherein the riser card includes a plurality of ground layers, a power layer, and a plurality of signal layers, one of the plurality of ground layers being interposed between the plurality of signal layers and the source compartment, when the riser card is positioned within the enclosure.

16. The riser card of claim 12, wherein the signal layer is physically connected to the ground layer.

17. The riser card of claim 16, wherein the signal layer is connected to the ground layer by way of a non-conductive material.

18. The riser card of claim 16, wherein the signal layer is in electrical communication with the ground layer.

19. The riser card of claim 18, wherein the signal layer is connected to the ground layer by way of a resistor.

* * * * *

UNITED STATES PATENT AND TRADEMARK OFFICE
CERTIFICATE OF CORRECTION

PATENT NO. : 6,723,915 B2
DATED : April 20, 2004
INVENTOR(S) : Radu et al.

It is certified that error appears in the above-identified patent and that said Letters Patent is hereby corrected as shown below:

<u>Title page,</u>
Item [75], Inventor, second inventor's name should read -- Russell K. Brovald --

Signed and Sealed this

Twelfth Day of July, 2005

JON W. DUDAS
*Director of the United States Patent and Trademark Office*